(12) United States Patent
Jang et al.

(10) Patent No.: US 9,799,800 B2
(45) Date of Patent: Oct. 24, 2017

(54) LIGHT EMITTING DEVICE AND METHOD OF FABRICATING THE SAME

(71) Applicant: Seoul Viosys Co., Ltd., Ansan-si (KR)

(72) Inventors: Sam Seok Jang, Ansan-si (KR); Woo Chul Kwak, Ansan-si (KR); Kyung Hae Kim, Ansan-si (KR); Jung Whan Jung, Ansan-si (KR); Yong Hyun Baek, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 14/830,651

(22) Filed: Aug. 19, 2015

(65) Prior Publication Data
US 2016/0056334 A1   Feb. 25, 2016

(30) Foreign Application Priority Data

Aug. 19, 2014  (KR) .................. 10-2014-0108021
Jun. 23, 2015  (KR) .................. 10-2015-0088823

(51) Int. Cl.
  *H01L 33/14*   (2010.01)
  *H01L 33/00*   (2010.01)
  *H01L 33/32*   (2010.01)
  *H01L 33/06*   (2010.01)

(52) U.S. Cl.
  CPC .......... *H01L 33/145* (2013.01); *H01L 33/007* (2013.01); *H01L 33/0075* (2013.01); *H01L 33/325* (2013.01); *H01L 33/06* (2013.01); *H01L 33/14* (2013.01)

(58) Field of Classification Search
  None
  See application file for complete search history.

(56) References Cited

U.S. PATENT DOCUMENTS

| 6,287,947 | B1 * | 9/2001 | Ludowise | H01S 5/0425 257/E33.07 |
|---|---|---|---|---|
| 8,268,706 | B2 * | 9/2012 | Kato | H01L 21/02378 257/E21.091 |
| 2004/0056259 | A1 * | 3/2004 | Goto | B82Y 20/00 257/79 |
| 2007/0096077 | A1 * | 5/2007 | Sanga | H01L 29/205 257/13 |
| 2008/0286610 | A1 * | 11/2008 | Deaton | H01L 51/5016 428/704 |

(Continued)

*Primary Examiner* — Michael Lebentritt
*Assistant Examiner* — Jordan Klein
(74) *Attorney, Agent, or Firm* — Perkins Coie LLP

(57) ABSTRACT

A light emitting device is provided to include an n-type semiconductor layer, a p-type semiconductor layer, an active layer, and an electron blocking layer disposed between the p-type semiconductor layer and the active layer. The p-type semiconductor layer includes a hole injection layer, a p-type contact layer, and a hole transport layer. The hole transport layer includes a plurality of undoped layers and at least one intermediate doped layer disposed between the undoped layers. At least one of the undoped layers includes a zone in which hole concentration decreases with increasing distance from the hole injection layer or the p-type contact layer, and the intermediate doped layer is disposed to be at least partially overlapped with a region of the hole transport layer, the region having the hole concentration of 62% to 87% of the hole concentration of the p-type contact layer.

20 Claims, 4 Drawing Sheets

(56) References Cited

U.S. PATENT DOCUMENTS

| | | | |
|---|---|---|---|
| 2010/0133506 A1* | 6/2010 | Nakanishi | B82Y 20/00 257/13 |
| 2012/0107991 A1* | 5/2012 | Huang | H01L 33/007 438/47 |
| 2013/0234110 A1* | 9/2013 | Kato | H01L 33/007 257/13 |
| 2013/0240348 A1* | 9/2013 | Mi | H01L 31/03044 204/157.5 |
| 2014/0014997 A1* | 1/2014 | Kato | H01L 33/32 257/98 |

* cited by examiner

LIGHT EMITTING DEVICE AND METHOD OF FABRICATING THE SAME

PRIORITY CLAIMS AND CROSS-REFERENCE TO RELATED APPLICATION

This patent document claims priorities and benefits of Korean Patent Application No. 10-2014-0108021, filed on Aug. 19, 2014, and Korean Patent Application No. 10-2015-0088823, filed on Jun. 23, 2015, the contents of which are incorporated by reference herein in its entirety.

TECHNICAL FIELD

Exemplary embodiments of the disclosure relate to a nitride semiconductor light emitting device including a p-type semiconductor layer and a method of fabricating the same.

BACKGROUND

Generally, a light emitting device employing nitride semiconductors includes an n-type semiconductor layer, an active layer, and a p-type semiconductor layer. In the active layer, electrons and holes are recombined to emit light. A recombination rate of electrons and holes in the active layer directly affects luminous efficacy of the light emitting device. In order to improve the recombination rate of electrons and holes in the active layer, it is necessary to prevent overflow of electrons. For this purpose, an electron blocking layer of a p-type AlGaN layer is adopted.

SUMMARY

Exemplary embodiments of the disclosure provide a light emitting device which has improved internal quantum efficiency through improvement in hole injection efficiency into an active layer and a method of fabricating the same.

Exemplary embodiments of the disclosure provide a light emitting device including a p-type semiconductor layer having a structure capable of improving hole mobility and a method of fabricating the same.

In accordance with one aspect of the present disclosure, a light emitting device includes: an n-type semiconductor layer; a p-type semiconductor layer; an active layer disposed between the n-type semiconductor layer and the p-type semiconductor layer; and an electron blocking layer disposed between the p-type semiconductor layer and the active layer, wherein the p-type semiconductor layer includes a hole injection layer, a p-type contact layer, and a hole transport layer disposed between the hole injection layer and the p-type contact layer. The hole transport layer includes a plurality of undoped layers and at least one intermediate doped layer disposed between the undoped layers. At least one of the undoped layers includes a zone in which hole concentration decreases with increasing distance from the hole injection layer or the p-type contact layer, and the intermediate doped layer is disposed to be at least partially overlapped with a region of the hole transport layer, the region having the hole concentration of 62% to 87% of the hole concentration of the p-type contact layer.

In some implementations, the hole injection layer can have a dopant concentration from $1\times10^{20}/cm^3$ to $5\times10^{20}/cm^3$, the p-type contact layer can have a dopant concentration of $4\times10^{20}/cm^3$ or more, and the intermediate doped layer can have a dopant concentration from $1\times10^{18}/cm^3$ to $1\times10^{20}/cm^3$.

In some implementations, the hole transport layer can have a greater thickness than a total thickness of the hole injection layer and the p-type contact layer.

In some implementations, the intermediate doped layer can have a thickness from 10 nm to 20 nm, and the undoped layers can have a thickness from 15 nm to 30 nm.

In some implementations, the hole injection layer can adjoin the electron blocking layer.

In some implementations, the zone in which the hole concentration decreases with increasing distance from the hole injection layer or the p-type contact layer can include a region in which the hole concentration linearly decreases.

In some implementations, at least one of the undoped layers can further include a zone in which the hole concentration increases with decreasing distance to the intermediate doped layer.

In some implementations, the zone in which the hole concentration increases with decreasing distance to the intermediate doped layer can include a region in which the hole concentration linearly increases.

In some implementations, the intermediate doped layer can have higher electrical resistance than the undoped layers.

In accordance with another aspect of the present disclosure, a method of fabricating a light emitting device includes: growing an n-type semiconductor layer, an active layer, an electron blocking layer, and a p-type semiconductor layer on a substrate within a chamber, wherein growth of the p-type semiconductor layer includes growing a hole injection layer on the substrate within the chamber by introducing an N source gas, a Ga source gas, an Mg source gas, $N_2$ gas, and $H_2$ gas into the chamber, growing an undoped layer on the hole injection layer by introducing an N source gas, a Ga source gas and $N_2$ gas into the chamber while blocking supply of the Mg source gas and $H_2$ gas, growing an intermediate doped layer on the undoped layer by introducing an N source gas, a Ga source gas, $N_2$ gas and an Mg source gas into the chamber, growing an undoped layer on the intermediate doped layer by introducing an N source gas, a Ga source gas, and $N_2$ gas into the chamber while blocking supply of the Mg source gas, and growing a p-type bonding layer on the undoped layers by introducing an N source gas, a Ga source gas, an Mg source gas, $N_2$ gas and $H_2$ gas into the chamber.

In some implementations, the fabrication method can further include introducing an N source gas and $N_2$ gas into the chamber while blocking supply of the Ga source gas, the Mg source gas and $H_2$ gas to change an atmosphere of the chamber into a nitrogen and $NH_3$ atmosphere, before growth of the hole injection layer.

In some implementations, the atmosphere of the chamber can be changed into the nitrogen and $NH_3$ atmosphere over 3 minutes to 10 minutes.

In some implementations, during growth of the hole injection layer and the p-type contact layer, a flow rate of the $H_2$ gas can be higher than the flow rate of the $N_2$ gas.

In some implementations, during growth of the hole injection layer and the p-type contact layer, a flow rate of the $H_2$ gas can be three to five times the flow rate of the $N_2$ gas.

In some implementations, during growth of the hole injection layer and the p-type contact layer, a flow rate of the $NH_3$ gas can be smaller than the flow rate of the $H_2$ gas, and during growth of the hole transport layer, a flow rate of the $N_2$ gas can be higher than the flow rate of the $NH_3$ gas.

In some implementations, during growth of the hole injection layer and the p-type contact layer, $N_2$, $H_2$ and $NH_3$ can be supplied at a flow rate ratio of 1:3:1, and during growth of the hole transport layer, $N_2$, $H_2$ and $NH_3$ can be supplied at a flow rate ratio of 3:0:1.

In some implementations, the fabrication method can further include heat-treating the p-type semiconductor layer within the chamber after growth of the p-type contact layer.

In some implementations, the hole injection layer can have a dopant concentration from $1\times10^{20}/cm^3$ to $5\times10^{20}/cm^3$, the p-type contact layer can have a dopant concentration of $4\times10^{20}/cm^3$ or more, and the intermediate doped layer can have a dopant concentration of $1\times10^{18}/cm^3$ to $1\times10^{20}/cm^3$.

In some implementations, the growing of the n-type semiconductor layer, the active layer, the electron blocking layer, and the p-type semiconductor layer includes performing a metal organic chemical vapor deposition.

In another aspect, a light emitting device is provided to comprise: a substrate; an n-type semiconductor layer formed over the substrate; an active layer formed over the n-type semiconductor layer; a p-type semiconductor layer formed over the active layer, wherein the p-type semiconductor layer includes undoped layers and a doped layer disposed between the undoped layers and the undoped layers include a hole concentration decreasing region and a hole concentration increasing region.

In some implementations, the p-type semiconductor layer further comprises: a hole injection layer formed under the doped layer; and a p-type contact layer formed over the doped layer.

In some implementations, the doped layer is arranged apart from the p-type contact layer such that the doped layer includes a region with a hole concentration of 62% to 87% of that of the p-type contact layer.

In some implementations, the sum of the thicknesses of the undoped layers and the doped layer is greater than the sum of the thickness of the hole injection layer and the p-type contact layer.

According to embodiments of the disclosure, the light emitting device includes a p-type semiconductor layer, which includes a hole transport layer having an intermediate doped layer disposed between undoped layers to enhance hole mobility, thereby enhancing hole injection efficiency of the light emitting device. In addition, during growth of the hole transport layer, supply of $H_2$ gas is blocked to reduce a dopant concentration of the undoped layers, thereby further increasing hole mobility in the hole transport layer. Further, due to increase in resistance by the intermediate doped layer of the hole transport layer, electric current caused by electrostatic discharge can be blocked by the intermediate doped layer, thereby improving electrostatic discharge withstand voltage characteristics of the light emitting device.

DETAILED DESCRIPTION OF EXEMPLARY EMBODIMENTS

Figure 1:
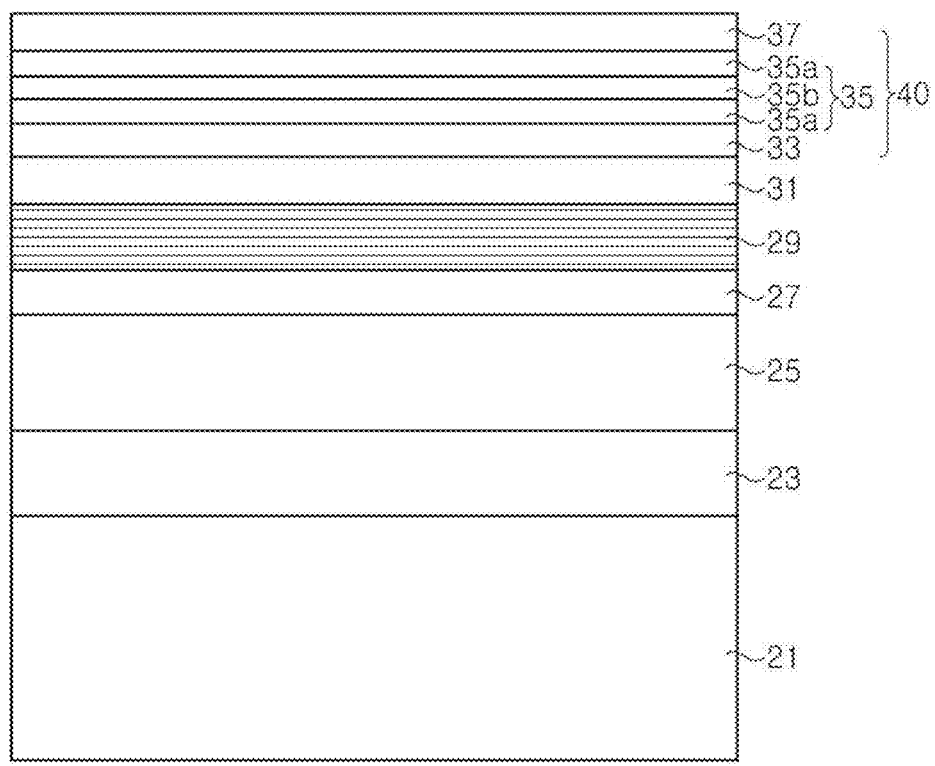
FIG. 1 is a schematic sectional view of an exemplary light emitting device according to one exemplary embodiment of the disclosure.

Hereinafter, exemplary embodiments of the disclosure will be described in more detail with reference to the accompanying drawings. The following embodiments are provided by way of example so as to fully convey the spirit of the present disclosure to those skilled in the art to which the present disclosure pertains. Accordingly, the present disclosure is not limited to the embodiments disclosed herein and can also be implemented in different forms. In the drawings, widths, lengths, thicknesses, and the like of elements can be exaggerated for clarity and descriptive purposes. When an element or layer is referred to as being "disposed on" or "disposed on" another element or layer, it can be directly "disposed on" or "disposed on" the other element or layer or intervening elements or layers can be present. Throughout the specification, like reference numerals denote like elements having the same or similar functions.

In order to increase hole injection efficiency from a p-type semiconductor layer into an active layer, a doping profile of the p-type semiconductor layer can be controlled. For example, a hole injection layer and a p-type contact layer can be divided and a dopant concentration of the hole injection layer can be adjusted to be lower than the p-type contact layer in order to increase the hole injection efficiency. Furthermore, an undoped layer can be formed between a clad layer and the hole injection layer or between the hole injection layer and the p-type contact layer.

With these techniques, it is possible to promote movement of holes injected into the active layer through increase in hole mobility within the hole injection layer. However, even in these techniques, since the hole injection layer is doped in a relatively low dopant concentration, there is a limit in increase in hole mobility.

Figure 2:
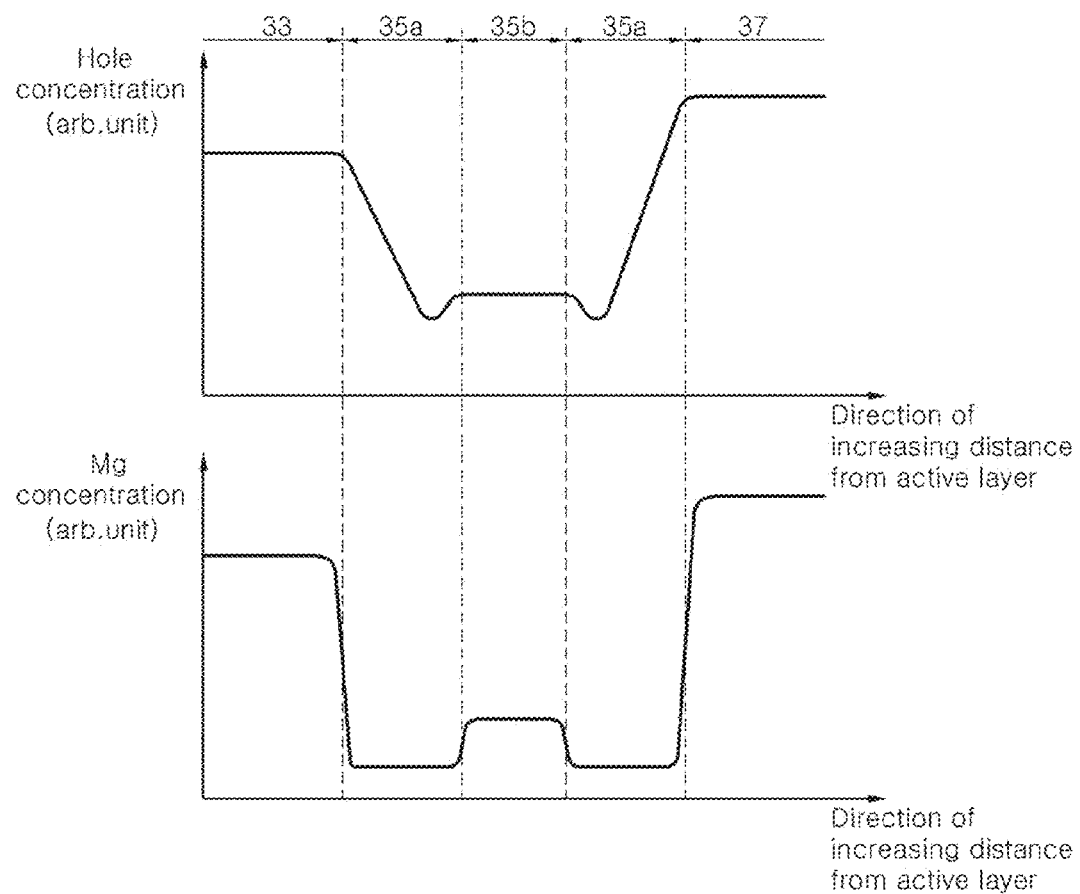
FIG. 2 is a graph depicting profiles of a hole concentration and an Mg concentration of the light emitting device according to the exemplary embodiment of the disclosure.

FIG. 1 is a schematic sectional view of an exemplary light emitting device according to one exemplary embodiment of the disclosure, and FIG. 2 is a graph depicting profiles of a hole concentration and an Mg concentration of the light emitting device according to the exemplary embodiment of the disclosure.

Referring to FIG. 1, the light emitting device can include a substrate 21, a buffer layer 23, an n-type semiconductor layer 25, a super-lattice layer 27, an active layer 29, an electron blocking layer 31, and a p-type semiconductor layer 40.

The substrate 21 can be or include, for example, a patterned sapphire substrate, a spinel substrate, a silicon carbide substrate, or a gallium nitride substrate, without being limited thereto.

The buffer layer 23 can include a low temperature buffer layer and a high temperature buffer layer. When the substrate 21 is a gallium nitride substrate, the buffer layer 23 can be omitted.

The n-type semiconductor layer 25 can include an n-type contact layer. The n-type semiconductor layer 25 can be formed of or include an (Al, Ga, In)N-based Group III nitride semiconductor layer, and can be composed of a single layer or multiple layers. For example, the n-type semiconductor layer 25 includes a GaN layer and can be formed by doping an n-type dopant, for example, Si.

The super-lattice layer 27 can be adopted to enhance current spreading while improving crystal quality of the active layer. The super-lattice layer 27 can be formed by repeatedly stacking, for example, GaN/InGaN or InGaN/InGaN. The super-lattice layer 27 is not limited thereto and can include a structure in which nitride semiconductor layers such as (Al, Ga, In)N are repeatedly stacked one above another in at least two layers.

The active layer 29 is disposed between the n-type semiconductor layer 25 and the p-type semiconductor layer 40, and can have a single quantum well structure including a single well layer or a multi-quantum well structure in which well layers and barrier layers are alternately stacked one above another. The well layer can be formed of or include, for example, InGaN, and the barrier layer can be formed of or include a gallium nitride-based semiconductor, for example, GaN, which has a greater band-gap than the well layer.

The electron blocking layer 31 is disposed between the active layer 29 and the p-type semiconductor layer 40, and prevents overflow of electrons from the active layer 29 to the p-type semiconductor layer 40. The electron blocking layer 31 can be formed of or include a gallium nitride-based semiconductor which generally has a larger band gap than the p-type semiconductor layer 40. For example, when the barrier layer includes GaN, the electron blocking layer 31 can include AlGaN.

The p-type semiconductor layer 40 includes a hole injection layer 33, a hole transport layer 35 and a p-type contact layer 37. In addition, the hole transport layer 35 can include undoped layers 35a and an intermediate doped layer 35b.

The hole injection layer 33, the hole transport layer 35 and the p-type contact layer 37 can be or include gallium nitride-based semiconductor layers, for example, GaN layers, which have the same composition except for the dopant concentration. Accordingly, hole supplied from an electrode (not shown) can pass through the p-type semiconductor layer 40 without being blocked by an energy barrier. The hole injection layer 33 can adjoin the electron blocking layer 31. In addition, the p-type contact layer 37 can contact an electrode (not shown).

The hole transport layer 35 can have a greater thickness than a total thickness of the hole injection layer 33 and the p-type contact layer 37. For example, the hole injection layer 33 can have a thickness from 5 nm to 20 nm, the hole transport layer 35 can have a thickness from 50 nm to 100 nm, and the p-type contact layer 37 can have a thickness from 10 nm to 30 nm. Further, in the hole transport layer 35, each of the undoped layers 35a can have a thickness from 15 nm to 30 nm and the intermediate doped layer 35b can have a thickness from 10 nm to 20 nm. In this embodiment, each of the undoped layers 35a can have a thickness of about 22 nm and the intermediate doped layer 35b can have a thickness of about 15 nm. Thus, the hole transport layer 35 including the undoped layers and the intermediate layer can have a thickness of about 60 nm. However, it should be understood that the present disclosure is not limited thereto and other implementations are also possible.

The hole injection layer 33 can have a dopant concentration of from $1\times10^{20}/cm^3$ to $5\times10^{20}/cm^3$ and the p-type contact layer 37 can have a dopant concentration of $4\times10^{20}/cm^3$ or more. In addition, the intermediate doped layer 35b of the hole transport layer can have a dopant concentration from $1\times10^{18}/cm^3$ to $1\times10^{20}/cm^3$. In this embodiment, the intermediate doped layer 35b can have a dopant concentration of $1\times10^{19}/cm^3$, without being limited thereto.

In this embodiment, the hole transport layer 35 can be relatively thickly formed and includes the intermediate doped layer 35b to achieve significant increase in hole mobility, thereby improving hole injection rate into the active layer 29. This structure is described in more detail hereinafter.

Holes injected into the p-type contact layer 37 can spread into the hole transport layer 35 depending upon a hole spreading distance. The hole spreading distance can be represented by Equation 1:

$$Lp=\sqrt{u \times t}$$ (Equation 1)

wherein Lp is a hole spreading distance, u is hole mobility, and t is lifetime of a hole.

According to Equation 1, holes of the p-type contact layer 37 can spread into the hole transport layer 35 and the hole spreading distance means a distance from the p-type contact layer 37 to a point at which the hole concentration becomes 0. In addition, when the hole concentration is sufficiently higher than an electron concentration, the hole concentration of the hole transport layer 35 can decrease with increasing distance from the p-type contact layer 37 or the hole injection layer 33. In the present disclosure, the hole transport layer 35 includes the undoped layers 35a, and at least one of the undoped layers 35a can include a zone in which the hole concentration decreases in proportion to increasing distance from the p-type contact layer 37 or the hole injection layer 33. Here, the zone in which the hole concentration decreases can include a region in which the hole concentration linearly decreases with increasing distance from the p-type contact layer 37, without being limited thereto. The hole concentration can non-linearly decrease. For example, the slope of the hole concentration can increase or decrease with increasing distance from the p-type contact layer 37 or the hole injection layer 33 in the hole transport layer 35. In addition, at least one of the undoped layers 35a can include a zone in which the hole concentration increases with decreasing distance to the intermediate doped layer 35b. The zone in which the hole concentration increases can include a region in which the hole concentration linearly increases with decreasing distance to the intermediate doped layer 35b, without being limited thereto.

For example, FIG. 2 depicts profiles of a hole concentration and an Mg concentration of the light emitting device according to the exemplary embodiment of the disclosure. In FIG. 2, a lower graph depicts a concentration profile of p-type dopants, for example, Mg, in the direction of increasing distance from the active layer, and an upper graph depicts a concentration profile of holes in the direction of increasing distance from the active layer.

Referring to FIG. 2, each of the hole injection layer 33, the p-type contact layer 37 and the intermediate doped layer 35b includes a predetermined concentration of p-type dopants (Mg). The hole injection layer 33 can have a higher Mg concentration than the intermediate doped layer 35b, and the p-type contact layer 37 can have a higher Mg concentration than the hole injection layer 33. On the contrary, the undoped layers 35a can include a much lower Mg concentration than the hole injection layer 33, the p-type contact layer 37 and the intermediate doped layer 35b, or can be substantially free from Mg. The undoped layers 35a can be grown by stopping supply of Mg such that the undoped layers 35a have an effective Mg concentration of 0. In some implementations, it is intended that the undoped layers 35a do not include the p-type dopants. In some embodiments, however, the undoped layers 35a can include a minute amount of Mg due to the Mg source remaining in the growth chamber, and can also include Mg diffused from at least one layer of the hole injection layer 33, the p-type contact layer 37 and the intermediate doped layer 35b due to diffusion of Mg. Accordingly, in some embodiments, the undoped layers 35a include unintended Mg.

In addition, as shown in FIG. 2, the hole injection layer 33 has a predetermined hole concentration, and the hole concentration of the undoped layer 35a adjoining the hole injection layer 33 gradually decreases with increasing distance from the active layer. Here, the hole concentration can linearly decrease at least in some zones. In the undoped layer 35a, the hole concentration gradually decreases with increasing distance from the hole injection layer 33 and increases again with decreasing distance to the intermediate doped layer 35b. Similarly, the hole concentration of the undoped layer 35a near the p-type contact layer 37 can gradually decrease with increasing distance from the intermediate doped layer 35b and increase again with decreasing distance to the p-type contact layer 37. Here, the hole concentration can linearly decrease at least in some zones.

According to the present disclosure, in the hole transport layer 35, the intermediate doped layer 35b can meet a region of the hole transport layer where the hole concentration of the hole transport layer is 62% to 87% of the hole concentration of the p-type contact layer 37. The intermediate doped layer 35b can be disposed to be at least partially overlapped with a region of the hole transport layer, where the hole concentration of the hole transport layer is 62% to 87% of the hole concentration of the p-type contact layer 37. As such, in the hole transport layer 35 including the undoped layers 35a, the intermediate doped layer 35b doped with a predetermined concentration is disposed to enhance hole mobility. That is, the intermediate doped layer 35b is disposed apart from the p-type contact layer 37 at a location where the concentration of holes supplied from the p-type contact layer 37 is decreased to a certain hole concentration, and acts as a stepping stone. Thus, hole mobility in the hole transport layer 35 can be increased to enhance hole injection rate into the active layer 29, thereby improving internal quantum efficiency. In this embodiment, the intermediate doped layer 35b can be disposed closer to the hole injection layer 33 than to the p-type contact layer 37, without being limited thereto.

In the light emitting device according to the aforementioned embodiments, the intermediate doped layer 35b can have relatively high resistance. Accordingly, when static electricity is induced in the light emitting device, electric current resulting from the static electricity can be blocked by the intermediate doped layer 35b having relatively high resistance, thereby improving electrostatic discharge withstand properties of the light emitting device.

Figure 3:
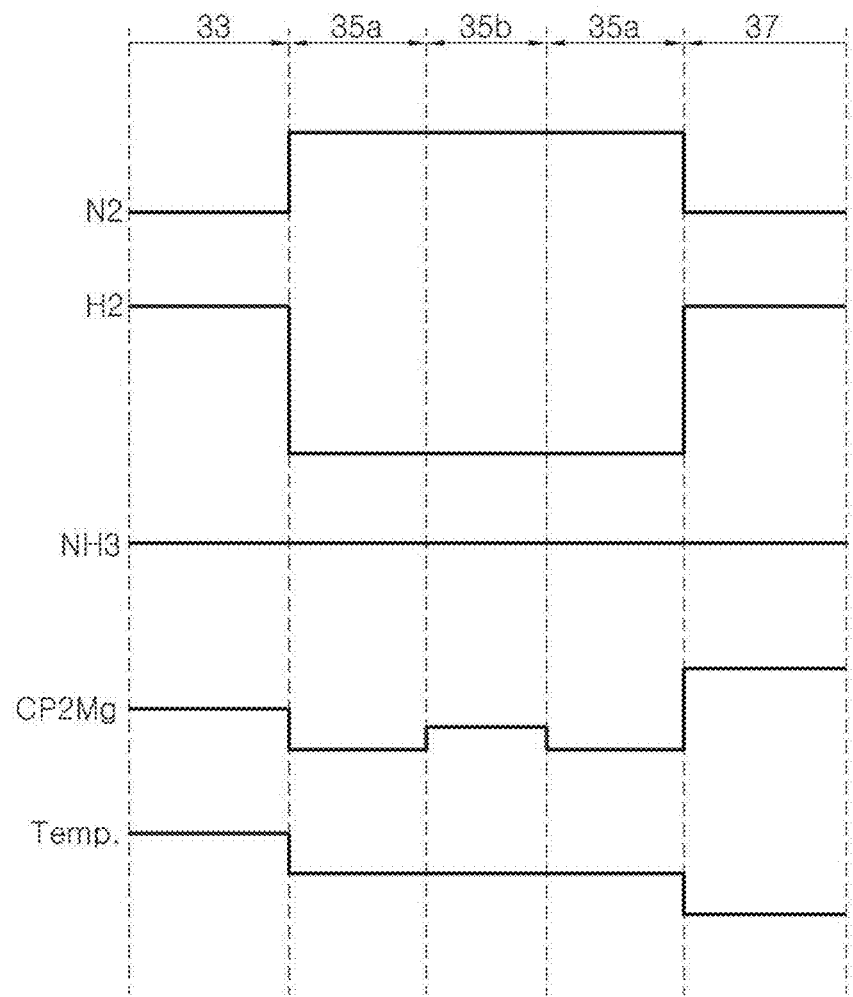
FIG. 3 is a diagram depicting gas and temperature profiles illustrating a method of fabricating the light emitting device according to the exemplary embodiment of the disclosure.

FIG. 3 is a diagram depicting gas and temperature profiles illustrating a method of fabricating a light emitting device including a process of growing a p-type semiconductor layer 40, according to one exemplary embodiment of the disclosure. In this embodiment, the p-type semiconductor layer 40 can be grown by metal organic chemical vapor deposition, and a buffer layer 23, an n-type semiconductor layer 25, a super-lattice layer 27, an active layer 29 and an electron blocking layer 31 can also be grown in-situ by metal organic chemical vapor deposition in the same chamber.

Referring to FIG. 1 and FIG. 3, with a substrate 21 loaded within the chamber, a metal source gas, an N source gas and a carrier gas or an atmosphere gas are supplied into the chamber to grown semiconductor layers including the buffer layer 23, the n-type semiconductor layer 25, the super-lattice layer 27, the active layer 29, the electron blocking layer 31, and the like. A source gas of n-type dopants can be supplied into the chamber, as needed.

The metal source gas includes at least one of a Ga source gas, an Al source gas or an In source gas, and a suitable source gas is supplied depending upon metal components of a gallium nitride-based semiconductor layer to be grown in the chamber. For example, generally, TMGa or TEGa can be used as the Ga source gas; TMAl or TEAl can be used as the Al source gas; and TMIn or TEIn can be used as the In source gas.

As the N source gas, $NH_3$ can be generally used, and as the source gas of n-type dopants, $SiH_4$ can be used. In addition, as the carrier gas or the atmosphere gas, $N_2$ and/or $H_2$ can be used.

After growth of the electron blocking layer 31, the p-type semiconductor layer 40 is grown within the chamber by metal organic chemical vapor deposition. The p-type semiconductor layer 40 can be generally grown at a pressure of 100 to 300 Torr.

First, a hole injection layer 33 is grown on the electron blocking layer 31 at a temperature of, for example, 970° C. to 990° C. The hole injection layer 33 can be grown by introducing the N source gas (for example, $NH_3$) and the Ga source gas (for example, TMGa and/or TEGa) together with an Mg source gas (for example, Cp2Mg), $N_2$ gas and $H_2$ gas into the chamber. In this case, the $N_2$ gas can be supplied at a flow rate of about 30 L/min to about 50 L/min, the $H_2$ gas can be supplied at a flow rate of about 140 L/min to about 160 L/min, and the $NH_3$ gas can be supplied at a flow rate of about 30 L/min to about 50 L/min. For example, the flow rate ratio of $N_2:H_2:NH_3$ can be 1:3:1. On the other hand, the flow rate of the Mg source gas is selected to achieve a suitable doping concentration and the hole injection layer 33 can have an Mg concentration of from about $1\times10^{20}/cm^3$ to about $5\times10^{20}/cm^3$.

After growth of the hole injection layer 33, undoped layers 35a of the hole transport layer 35 are grown at a temperature of, for example, 940° C. to 970° C. The undoped layers 35a are grown by introducing the N source gas (for example, $NH_3$), the Ga source gas (for example, TMGa or TEGa) and $N_2$ gas into the chamber while blocking supply of the Mg source gas and $H_2$ gas. For example, the $N_2$ source gas can be supplied at a flow rate of about 140 L/min to about 160 L/min, the $H_2$ source gas can be supplied at a flow rate of about 0 L/min, and the $NH_3$ gas can be supplied at a flow rate of about 30 L/min to about 50 L/min. For example, the flow rate ratio of $N_2:H_2:NH_3$ can be 3:0:1.

Generally, even in the case where the Mg source gas is not supplied, Mg is supplied from the hole injection layer 33 into the undoped layer 35a during growth of the undoped layer 35a. When $H_2$ gas is supplied during growth of the undoped layers 35a, supply of Mg can be further promoted. Accordingly, by blocking supply of $H_2$ during growth of the undoped layers 35a, the dopant concentration of the undoped layers 35a can be reduced. On the other hand, during growth of the undoped layer 35a, the Mg source gas is supplied to grow an intermediate doped layer 35b. Then, after stopping growth of the intermediate doped layer 35b by blocking supply of the Mg source gas, another undoped layer 35a is grown thereon, thereby forming the hole transport layer 35 according to the exemplary embodiment of the disclosure.

On the other hand, the flow rate of the Mg source gas is selected to achieve a suitable doping concentration, and the intermediate doped layer 35b of the hole transport layer 35 can have an Mg concentration of from about $1\times10^{18}/cm^3$ to about $1\times10^{20}/cm^3$. In addition, the intermediate doped layer 35b has an Mg concentration that is higher than the undoped layers 35a and is lower than the hole injection layer 33.

On the other hand, before growth of the hole transport layer 35, the atmosphere of the chamber can be changed into nitrogen and $NH_3$ atmosphere. For this purpose, before growth of the undoped layer 35a, an N source gas and N₂ gas can be supplied while blocking supply of the Ga source gas, the Mg source gas and H₂ gas. A process of changing the atmosphere of the chamber into the nitrogen and NH₃ atmosphere can be performed for about 3 to about 10 minutes.

After growth of the hole transport layer 35, a p-type contact layer 37 is grown at a temperature of, for example, 910° C. to 940° C. The p-type contact layer 37 is grown on the hole transport layer 35 by introducing the N source gas (for example, NH₃), the Ga source gas (for example, TMGa or TEGa), the Mg source gas (for example, Cp2Mg), N₂ gas and H₂ gas into the chamber. For example, the N₂ source gas can be supplied at a flow rate of about 30 L/min to about 50 L/min, the H₂ source gas can be supplied at a flow rate of about 140 L/min to about 160 L/min, and the NH₃ gas can be supplied at a flow rate of about 30 L/min to about 50 L/min. For example, the flow rate ratio of N₂:H₂:NH₃ can be 1:3:1, and the growth conditions of the p-type contact layer 37 can be the same as those of the hole injection layer 33 except for the flow rate of the Mg source gas. On the other hand, the flow rate of the Mg source gas is selected to achieve a suitable doping concentration, and the p-type contact layer 37 can have an Mg concentration of about $4 \times 10^{20}/cm^3$ or more.

After growth of the p-type contact layer 37, the temperature of the chamber can be decreased to about 700° C. to about 800° C. to perform heat treatment of the p-type semiconductor layer 40 in an N₂ atmosphere.

According to this exemplary embodiment, during growth of the hole transport layer 35, supply of H₂ gas is blocked to reduce the doping concentration of the undoped layers 35a in the hole transport layer 35. Further, during growth of the hole injection layer 33 and the p-type contact layer 37, N₂ gas and H₂ gas can be supplied to prevent deterioration in crystal quality of the p-type semiconductor layer 40. In addition, during growth of the hole transport layer 35, the intermediate doped layer 35b is grown to enhance hole mobility from the p-type contact layer 37 to the hole transport layer 35.

Next, electrodes contacting the n-type semiconductor layer 25 and the p-type semiconductor layer 40 are formed, and division of the resulting structure into individual light emitting device chips is performed, thereby providing a lateral type or a flip-chip type light emitting device. Furthermore, a support substrate (not shown) can be formed on the p-type semiconductor layer 40 and the substrate 21 can be removed, thereby providing a vertical type light emitting device from which the growth substrate is removed.

Figure 4:
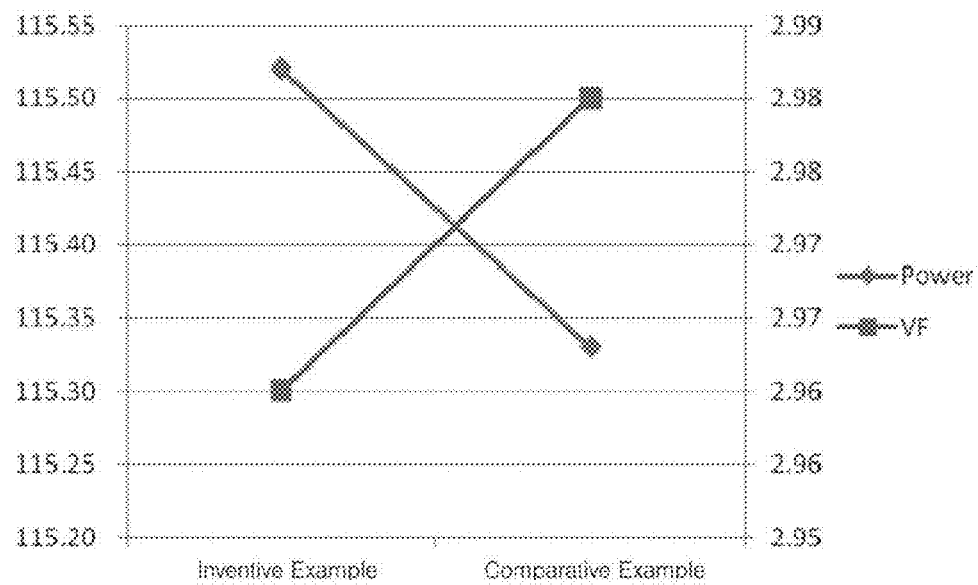
FIG. 4 and FIG. 5 are graphs comparing power, forward voltage and electrostatic discharge withstand voltage of an exemplary embodiment and a comparative example.
Figure 5:
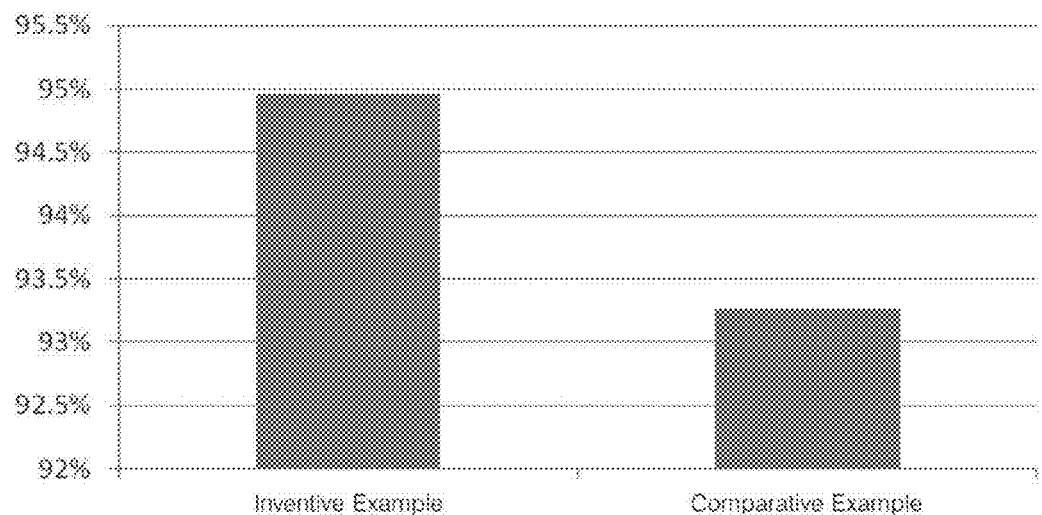

FIG. 4 is a graph depicting power and forward voltage of light emitting devices of an inventive example and a comparative example, and FIG. 5 is a graph depicting electrostatic discharge withstand yield of the inventive example and the comparative example.

In this experiment, the light emitting device of the inventive example was a lateral type light emitting device including a hole transport layer 35 including an intermediate doped layer 35b, and the light emitting device of the comparative example was a lateral type light emitting device including a hole transport layer without the intermediate doped layer. In the inventive example and the comparative example, data were obtained from 40,000 light emitting devices fabricated from the respective wafers. Thus, in FIG. 4, power and forward voltages (Vf) are average values of the light emitting devices prepared in the inventive examples and average values of the light emitting devices prepared in the comparative examples. Further, in FIG. 5, the electrostatic discharge yield indicates a ratio of non-failed light emitting devices to all of the light emitting devices after electrostatic discharge testing. That is, the electrostatic discharge yield indicates a ratio of non-failed light emitting devices to 40,000 light emitting devices prepared in the inventive example, and a ratio of non-failed light emitting devices to 40,000 light emitting devices prepared in the comparative example. The electrostatic discharge testing was performed by applying a voltage of 3 kV in an HBM mode.

As shown in FIG. 4, the light emitting devices of the inventive example exhibited lower forward voltages and higher light emitting power than the light emitting devices of the comparative example. That is, it can be seen that the light emitting devices of the inventive example each including the intermediate doped layer 35b have higher luminous efficacy and allow easier recombination of holes and electrons than the light emitting devices of the comparative example that do not include the intermediate doped layer. In addition, as shown in FIG. 5, it can be seen that the light emitting devices of the inventive example had higher electrostatic discharge withstand voltages than the light emitting devices of the comparative example.

Although the disclosure has been illustrated with reference to some embodiments in conjunction with the drawings, it will be apparent to those skilled in the art that various modifications, changes and substitutions can be made to the disclosure without departing from the spirit and scope of the disclosure. Therefore, it should be understood that these embodiments and the accompanying drawings are not to be construed as limiting the present disclosure, but are given to facilitate the understanding of some implementations of the disclosure to those skilled in the art. The scope of the present disclosure should be interpreted according to the following appended claims as covering all modifications or variations derived from the appended claims and equivalents thereof.

What is claimed is:

1. A light emitting device, comprising:
an n-type semiconductor layer;
a p-type semiconductor layer;
an active layer disposed between the n-type semiconductor layer and the p-type semiconductor layer; and
an electron blocking layer disposed between the p-type semiconductor layer and the active layer,
wherein:
the p-type semiconductor layer includes a hole injection layer, a p-type contact layer, and a hole transport layer disposed between the hole injection layer and the p-type contact layer, and
the hole transport layer includes first and second low-doped layers and at least one intermediate doped layer disposed between the first and second low-doped layers, wherein the first low-doped layer adjoins the p-type contact layer and wherein dopant concentrations of the first and second low-doped layers are less than a dopant concentration of the at least one intermediate doped layer, wherein the dopant concentration of the first low-doped layer decreases with increasing distance from the intermediate doped layer and then increases with decreasing distance to the p-type contact layer.

2. The light emitting device of claim 1, wherein the hole injection layer has a dopant concentration from $1 \times 10^{20}/cm^3$ to $5 \times 10^{20}/cm^3$, the p-type contact layer has a dopant concentration of $4 \times 10^{20}/cm^3$ or more, and the intermediate doped layer has a dopant concentration from $1 \times 10^{18}/cm^3$ to $1 \times 10^{20}/cm^3$.

3. The light emitting device of claim 1, wherein the hole transport layer has a greater thickness than a total thickness of the hole injection layer and the p-type contact layer.

4. The light emitting device of claim 3, wherein the intermediate doped layer has a thickness from 10 nm to 20 nm, and the low-doped layers have a thickness from 15 nm to 30 nm.

5. The light emitting device of claim 1, wherein the hole injection layer adjoins the electron blocking layer.

6. The light emitting device of claim 1, wherein the first low-doped layer includes a zone in which a hole concentration decreases with increasing distance from the hole injection layer.

7. The light emitting device of claim 1, wherein the first low-doped layer further includes a zone in which a hole concentration increases with decreasing distance to the intermediate doped layer.

8. The light emitting device of claim 7, wherein the zone in which the hole concentration increases with decreasing distance to the intermediate doped layer includes a region in which the hole concentration linearly increases.

9. The light emitting device of claim 1, wherein the intermediate doped layer has higher electrical resistance than the low-doped layers.

10. A method of fabricating a light emitting device, including:
    growing an n-type semiconductor layer, an active layer, an electron blocking layer, and a p-type semiconductor layer on a substrate within a chamber,
    wherein the growing the p-type semiconductor layer includes:
    growing a hole injection layer on the substrate within the chamber by introducing an N source gas, a Ga source gas, an Mg source gas, N2 gas, and H2 gas into the chamber;
    growing an undoped layer on the hole injection layer by introducing an N source gas, a Ga source gas and N2 gas into the chamber while blocking introducing of the Mg source gas and H2 gas;
    growing an intermediate doped layer on the undoped layer by introducing an N source gas, a Ga source gas, N2 gas and an Mg source gas into the chamber;
    growing an undoped layer on the intermediate doped layer by introducing an N source gas, a Ga source gas, and N2 gas into the chamber while blocking introducing of the Mg source gas; and
    growing a p-type contact layer on the undoped layers by introducing an N source gas, a Ga source gas, an Mg source gas, N2 gas and H2 gas into the chamber.

11. The method of claim 10, further including:
    introducing an N source gas and N2 gas into the chamber while blocking introducing of a Ga source gas, an Mg source gas and H2 gas to change an atmosphere of the chamber into a nitrogen and NH3 atmosphere, before the growing the hole injection layer.

12. The method of claim 10, wherein the hole injection layer has a dopant concentration from $1 \times 10^{20}/cm^3$ to $5 \times 10^{20}/cm^3$, the p-type contact layer has a dopant concentration of $4 \times 10^{20}/cm^3$ or more, and the intermediate doped layer has a dopant concentration of from $1 \times 10^{18}/cm^3$ to $1 \times 10^{20}/cm^3$.

13. The method of claim 10, wherein the growing of the n-type semiconductor layer, the active layer, the electron blocking layer, and the p-type semiconductor layer includes performing a metal organic chemical vapor deposition.

14. A light emitting device, comprising:
    a substrate;
    an n-type semiconductor layer formed over the substrate;
    an active layer formed over the n-type semiconductor layer;
    a p-type semiconductor layer formed over the active layer, wherein the p-type semiconductor layer includes first and second low-doped layers and a doped layer disposed between the low-doped layers and the second low-doped layers include a hole concentration decreasing with increasing distance from the active layer and then increasing with decreasing distance to the doped layer; and
    a p-type contact layer formed over the doped layer, and wherein the first low-doped layer adjoins the p-type contact layer and has a dopant concentration less than that of the doped layer.

15. The light emitting device of claim 14, wherein the p-type semiconductor layer further comprises:
    a hole injection layer formed under the doped layer.

16. The light emitting device of claim 15, wherein the doped layer is arranged apart from the p-type contact layer such that the doped layer includes a region with a hole concentration of 62% to 87% of that of the p-type contact layer.

17. The light emitting device of claim 15, wherein the sum of the thicknesses of the first and second low-doped layers and the doped layer is greater than the sum of the thickness of the hole injection layer and the p-type contact layer.

18. The light emitting device of claim 15, further comprising an electron blocking layer disposed between the active layer and the hole injection layer such that the hole injection layer adjoins the electron blocking layer.

19. The light emitting device of claim 14, wherein the first low-doped layer includes a zone in which a hole concentration increases with decreasing distance to the doped layer.

20. The light emitting device of claim 19, wherein the zone in which the hole concentration increases with decreasing distance to the doped layer includes a region in which the hole concentration linearly increases.

* * * * *